United States Patent
Lin et al.

(10) Patent No.: US 8,614,152 B2
(45) Date of Patent: Dec. 24, 2013

(54) GATE STRUCTURE AND A METHOD FOR FORMING THE SAME

(75) Inventors: Chien-Liang Lin, Taoyuan County (TW); Gin-Chen Huang, Taipei County (TW); Ying-Wei Yen, Miaoli County (TW); Yu-Ren Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 18 days.

(21) Appl. No.: 13/115,186

(22) Filed: May 25, 2011

(65) Prior Publication Data

US 2012/0299124 A1 Nov. 29, 2012

(51) Int. Cl.
*H01L 21/31* (2006.01)

(52) U.S. Cl.
USPC .............. 438/786; 257/411; 257/E21.267; 257/E21.302

(58) Field of Classification Search
USPC ............ 438/592, 786; 257/E21.267, 411, 257/E21.302
See application file for complete search history.

(56) References Cited

U.S. PATENT DOCUMENTS

| | | | |
|---|---|---|---|
| 5,108,945 A * | 4/1992 | Matthews | 438/384 |
| 5,567,638 A | 10/1996 | Lin | |
| 5,739,563 A * | 4/1998 | Kawakubo et al. | 257/295 |
| 6,043,138 A | 3/2000 | Ibok | |
| 6,867,084 B1 * | 3/2005 | Chiu et al. | 438/216 |
| 6,921,963 B2 | 7/2005 | Krivokapic | |
| 7,087,477 B2 | 8/2006 | Fried | |
| 7,091,551 B1 | 8/2006 | Anderson | |
| 7,465,649 B2 | 12/2008 | Chan | |
| 7,470,570 B2 | 12/2008 | Beintner | |
| 7,531,437 B2 | 5/2009 | Brask | |
| 7,569,857 B2 | 8/2009 | Tolchinsky | |
| 2003/0155582 A1 * | 8/2003 | Mahajani et al. | 257/200 |
| 2006/0286729 A1 | 12/2006 | Kavalieros | |
| 2007/0108528 A1 | 5/2007 | Anderson | |
| 2008/0157208 A1 | 7/2008 | Fischer | |
| 2009/0108291 A1 | 4/2009 | Cheng | |
| 2009/0242964 A1 | 10/2009 | Akil | |
| 2009/0269916 A1 | 10/2009 | Kang | |
| 2010/0072553 A1 | 3/2010 | Xu | |
| 2010/0167506 A1 | 7/2010 | Lin | |

FOREIGN PATENT DOCUMENTS

| | | |
|---|---|---|
| TW | 424358 | 3/2001 |
| TW | I276169 | 3/2007 |
| TW | 200834919 | 8/2008 |
| TW | 200947626 | 11/2009 |

* cited by examiner

*Primary Examiner* — Amar Movva
(74) *Attorney, Agent, or Firm* — Ding Yu Tan

(57) ABSTRACT

A method for forming a gate structure includes the following steps. A substrate is provided. A silicon oxide layer is formed on the substrate. A decoupled plasma-nitridation process is applied to the silicon oxide layer so as to form a silicon oxynitride layer. A first polysilicon layer is formed on the silicon oxynitride layer. A thermal process is applied to the silicon oxynitride layer having the first polysilicon layer. After the thermal process, a second polysilicon layer is formed on the first polysilicon layer. The first polysilicon layer can protect the gate dielectric layer during the thermal process. The nitrogen atoms inside the gate dielectric layer do not lose out of the gate dielectric layer. Thus, the out-gassing phenomenon can be avoided, and a dielectric constant of the gate dielectric layer can not be changed, thereby increasing the reliability of the gate structure.

9 Claims, 3 Drawing Sheets

GATE STRUCTURE AND A METHOD FOR FORMING THE SAME

FIELD OF THE INVENTION

The present invention relates to a gate structure and a method for forming the gate structure, and particularly to a gate structure including a polysilicon layer which is formed on a gate dielectric layer by using several processes.

BACKGROUND OF THE INVENTION

In a process of forming a gate structure using a semiconductor technology, a gate dielectric layer such as a silicon oxynitride (SiON) is formed on a substrate, and then a polysilicon layer is formed on the gate dielectric layer. Generally, a single wafer tool or a furnace tool is applied so that the polysilicon layer is formed by using a single deposition step. Before forming the polysilicon layer, an annealing process is conventionally performed. However, during the annealing process, a number of nitrogen atoms inside the gate dielectric layer diffuse in the gate dielectric layer to lose out of the gate dielectric layer, which is called an out-gassing phenomenon. Due to the loss of the nitrogen atoms of the gate dielectric layer, a dielectric constant of the gate dielectric layer is decreased. In other words, if the gate dielectric layer wants to have a desired dielectric constant, a thickness of the gate dielectric layer will be increased. In addition, a leakage current of a semiconductor component with the polysilicon layer using the conventional method will increase, thereby reducing the reliability of the semiconductor component and affecting the performance of the semiconductor component.

Therefore, what is needed is a gate structure and a method for forming the gate structure to overcome the above disadvantages.

SUMMARY OF THE INVENTION

The present invention provides a method for forming a gate structure so as to avoid an out-gassing phenomenon of a gate dielectric layer during a thermal process, thereby improving the performance of the gate structure.

The present invention provides a gate structure so as to improve the performance of a semiconductor component having the gate structure.

The present invention provides a method for forming a gate structure. At first, a substrate is provided. Next, a silicon oxide layer is formed on the substrate. Next, a decoupled plasma-nitridation process is applied to the silicon oxide layer so as to form a silicon oxynitride layer. Next, a first polysilicon layer is formed on the silicon oxynitride layer. Next, a thermal process is applied to the silicon oxynitride layer having the first polysilicon layer. Next, after the thermal process, a second polysilicon layer is formed on the first polysilicon layer.

In one embodiment of the present invention, the silicon oxide layer is formed on the substrate by using an in-situ steam generation method.

In one embodiment of the present invention, a thickness of the silicon oxide layer is in a range from 10 angstroms to 20 angstroms.

In one embodiment of the present invention, an operating pressure of the decoupled plasma-nitridation process is in a range from 5 millitorrs to 25 millitorrs.

In one embodiment of the present invention, a total operating time of the decoupled plasma-nitridation process is in a range from 70 seconds to 80 seconds.

In one embodiment of the present invention, a thickness of the first polysilicon layer is in a range from 100 angstroms to 200 angstroms.

In one embodiment of the present invention, the thermal process includes a first annealing process and a second annealing process. In the first annealing process, a first gas at a first temperature is introduced. In the second annealing process, a second gas at a second temperature is introduced.

In one embodiment of the present invention, the first gas is nitrogen, and the first temperature is in a range from 750° C. to 850° C.

In one embodiment of the present invention, the second gas is oxygen, and the second temperature is in a range from 550° C. to 650° C.

In one embodiment of the present invention, the first polysilicon layer and the second polysilicon layer are formed by using an in-situ di-silane method.

In one embodiment of the present invention, a thickness of the second polysilicon layer is in a range from 500 angstroms to 600 angstroms.

The present invention further provides a gate structure including a gate dielectric layer, a first polysilicon layer undergoing a thermal process and a second polysilicon layer, in which the first polysilicon layer comprises a plurality of nitrogen atoms therein. The first polysilicon layer undergoing the thermal process is formed on the gate dielectric layer. The second polysilicon layer is formed on the first polysilicon layer undergoing the thermal process. The average lattice structure of the first polysilicon layer undergoing the thermal process is bigger than the average lattice structure of the second polysilicon layer.

In one embodiment of the present invention, the gate dielectric layer is a silicon oxynitride (SiON) layer.

In one embodiment of the present invention, a thickness of the first polysilicon layer undergoing the thermal process is in a range from 100 angstroms to 200 angstroms.

In one embodiment of the present invention, a lattice structure of the first polysilicon layer undergoing the thermal process is a crystalline structure.

In one embodiment of the present invention, the first polysilicon layer undergoing the thermal process includes a plurality of nitrogen atoms distributing near to a bottom of the first polysilicon layer undergoing the thermal process.

In one embodiment of the present invention, a lattice structure of the first polysilicon layer undergoing the thermal process is bigger than a lattice structure of the second polysilicon layer.

In one embodiment of the present invention, a lattice structure of the second polysilicon layer is an amorphous structure.

In one embodiment of the present invention, a thickness of the second polysilicon layer is in a range from 500 angstroms to 600 angstroms In the method for forming the gate structure of the present invention, at first, a first polysilicon layer is formed on a gate dielectric layer. Then, a thermal process is applied to the gate dielectric layer with the first polysilicon layer. The first polysilicon layer can protect the gate dielectric layer during the thermal process so that the nitrogen atoms inside the gate dielectric layer do not lose out of the gate dielectric layer. Thus, the out-gassing phenomenon can be avoided, and a dielectric constant of the gate dielectric layer can not be changed. Further, a leakage current of a semiconductor component using the gate structure will be reduced, thereby increasing the reliability of the semiconductor component and improving the performance of the semiconductor component.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 6:
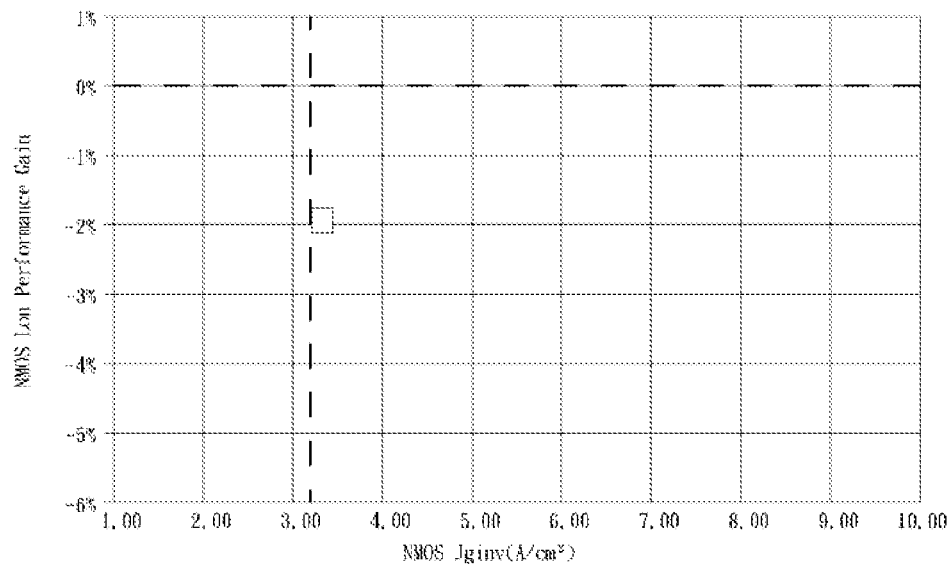
FIG. 6 illustrates a graph of the ion performance gain and the leakage current of an N-type metal oxide semiconductor field-effect transistor (NMOSFET) in accordance with an embodiment of the present invention.
Figure 7:
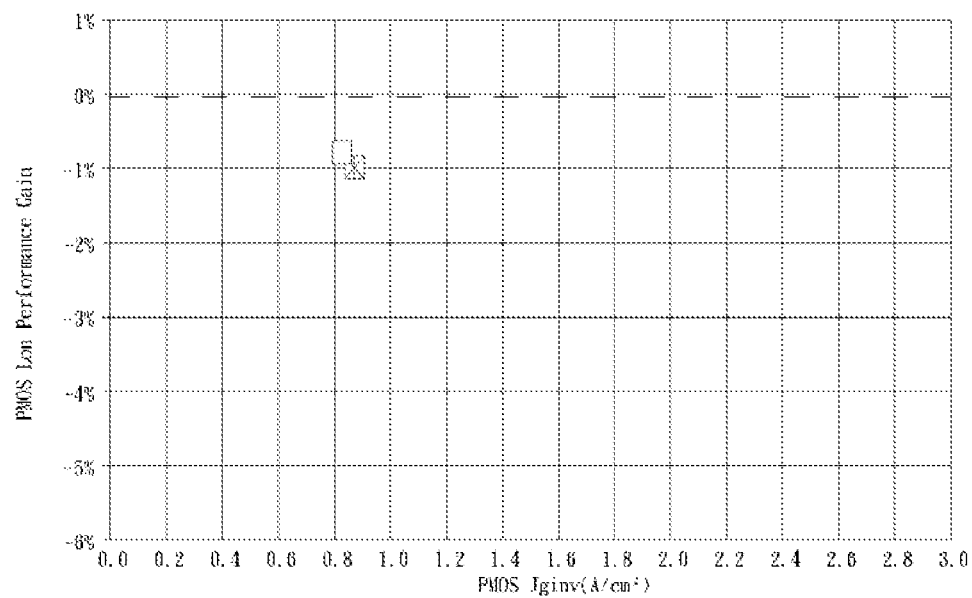
FIG. 7 illustrates a graph of the ion performance gain and the leakage current of a P-type metal oxide semiconductor field-effect transistor (PMOSFET) in accordance with an embodiment of the present invention.

FIGS. 1-5 illustrate a process flow of a method for forming a gate structure in accordance with an embodiment of the present invention. FIG. 6 illustrates a graph of the ion performance gain and the leakage current of an N-type metal oxide semiconductor field-effect transistor in accordance with an embodiment of the present invention. FIG. 7 illustrates a graph of the ion performance gain and the leakage current of a P-type metal oxide semiconductor field-effect transistor in accordance with an embodiment of the present invention.

Figure 1:
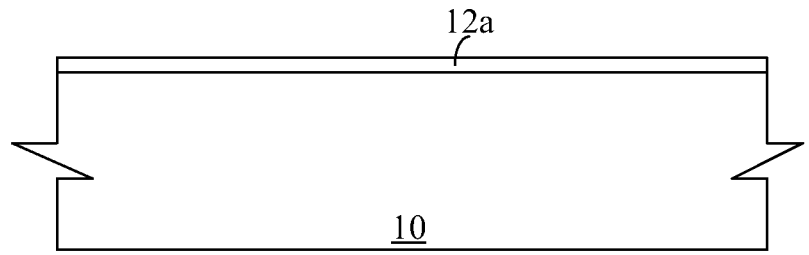
FIG. 1 illustrates a schematic, cross-sectional view of a substrate on which a silicon oxide layer is formed in accordance with an embodiment of the present invention.

Referring to FIG. 1, FIG. 1 illustrates a schematic, cross-sectional view of a substrate on which a silicon oxide layer is formed. At first, a substrate 10 is provided. Preferably, a cleaning process is applied to the substrate 10 to clean the substrate 10. Next, a silicon oxide layer 12a is formed on the substrate 10 by using an in-situ steam generation method. A thickness of the silicon oxide layer 12a is in a range from 10 angstroms to 20 angstroms. In the present embodiment, a silicon oxide layer 12a can be silicon dioxide ($SiO_2$). In addition, in the present embodiment, the substrate 10 can include an isolation structure (not shown) disposed therein. The isolation structure can be a field oxide region (not shown) or a shallow trench isolation (not shown). The formation, structure and function of the isolation structure are known, and are not described here.

Figure 2:
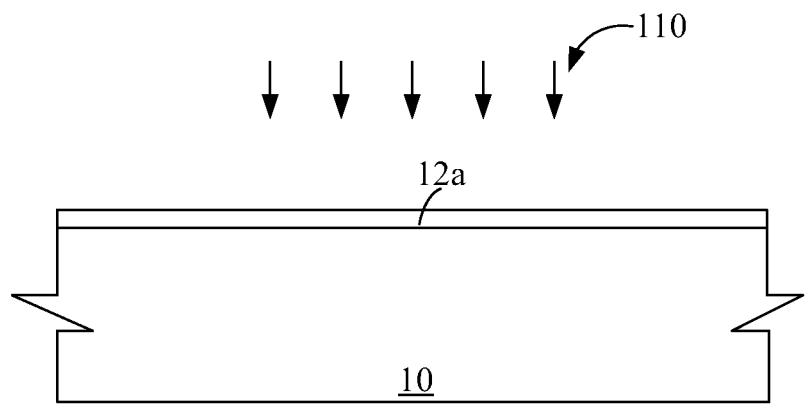
FIG. 2 illustrates a schematic, cross-sectional view of the substrate shown in FIG. 1, to which a decoupled plasma-nitridation process is applied so as to form a silicon oxynitride layer as a gate dielectric layer on the silicon oxide layer in accordance with an embodiment of the present invention.

Next, referring to FIG. 2, FIG. 2 illustrates a schematic, cross-sectional view of the substrate shown in FIG. 1, to which a decoupled plasma-nitridation process is applied so as to form a silicon oxynitride layer as a gate dielectric layer on the silicon oxide layer. In detail, a decoupled plasma-nitridation process 110 is applied to the silicon oxide layer 12a so as to form a silicon oxynitride layer (SiON) 12b in a range from 10 angstroms to 15 angstroms on the silicon oxide layer 12a. The silicon oxide layer 12a and the silicon oxynitride layer 12b cooperate to serve as a gate dielectric layer 12. An operating pressure of the decoupled plasma-nitridation process 110 is 5 millitorrs to 25 millitorrs. A duty cycle of the decoupled plasma-nitridation process 110 is 20%. A total operating time of the decoupled plasma-nitridation process 110 is in a range from 70 seconds to 80 seconds.

Figure 3:
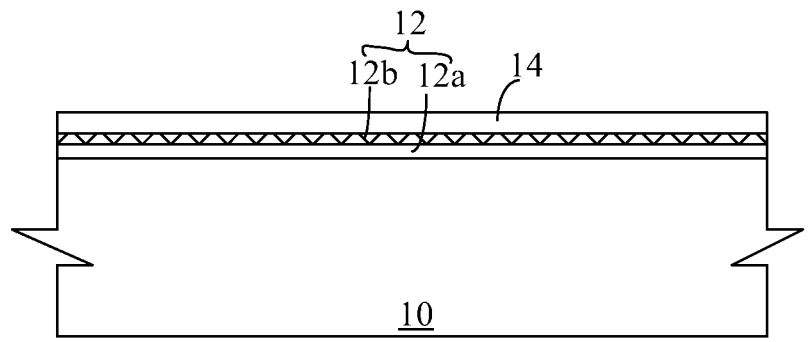
FIG. 3 illustrates a schematic, cross-sectional view of the substrate with the silicon oxynitride layer after the decoupled plasma-nitridation process, on which a first polysilicon layer is formed in accordance with an embodiment of the present invention.
Figure 4:
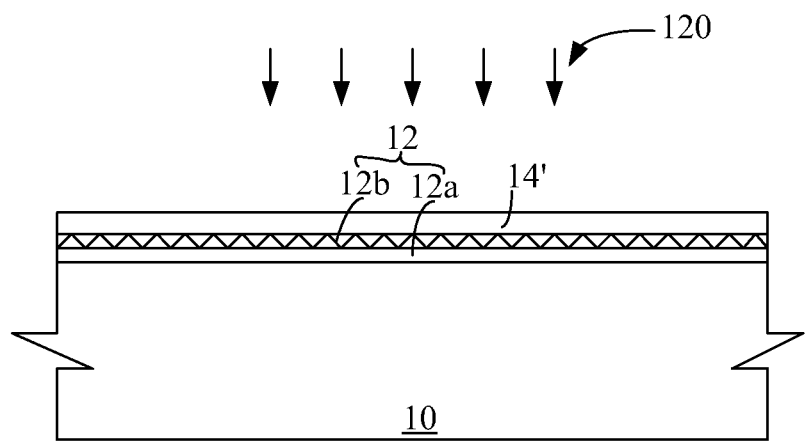
FIG. 4 illustrates a schematic, cross-sectional view of the substrate shown in FIG. 3, to which a thermal process is applied so as to form a first polysilicon layer undergoing the thermal process in accordance with an embodiment of the present invention.

Next, referring to FIG. 3, FIG. 3 illustrates a schematic, cross-sectional view of the substrate with the silicon oxynitride layer after the decoupled plasma-nitridation process, on which a first polysilicon layer is formed. In the present embodiment, after the decoupled plasma-nitridation process 110, a first polysilicon layer 14 is formed on the gate dielectric layer 12 by using an in-situ di-silane method. A thickness of the first polysilicon layer 14 is in a range from 100 angstroms to 200 angstroms. Next, referring to FIG. 4, FIG. 4 illustrates a schematic, cross-sectional view of the substrate shown in FIG. 3, to which a thermal process is applied so as to form the first polysilicon layer undergoing the thermal process. As shown in FIG. 4, a thermal process 120 is applied to the gate dielectric layer 12 having the first polysilicon layer 14 on the substrate 10. As a result, the first polysilicon layer 14 on the gate dielectric layer 12 is transformed into a first polysilicon layer undergoing the thermal process 14'. In the present embodiment, the thermal process 120 includes a first annealing process and a second annealing process. In the first annealing process, a first gas at a first temperature is introduced to the gate dielectric layer 12 and the first polysilicon layer 14 on the substrate 10. The first gas can be, for example, nitrogen. The first temperature can be in a range from 750° C. to 850° C. An operating time of the first annealing process is in a range from 15 seconds to 90 seconds. After the first annealing process, the second annealing process is performed. In the second annealing process, a second gas at a second temperature is introduced to the gate dielectric layer 12 and the first polysilicon layer 14 on the substrate 10. The first gas can be, for example, oxygen. The first temperature can be in a range from 550° C. to 650° C. An operating time of the first annealing process is in a range from 15 seconds to 90 seconds. In addition, the thermal process also includes UV anneal or Laser anneal in the embodiment of the present invention.

Because the gate dielectric layer 12 is covered by the first polysilicon layer 14, the first polysilicon layer 14 can protect the gate dielectric layer 12 during the thermal process 120. Thus, a number of nitrogen atoms 142 inside the gate dielectric layer 12 do not lose out of the gate dielectric layer 12. Thus, the out-gassing phenomenon can be avoided. In other words, the number of the nitrogen atoms 142 inside the gate dielectric layer 12 will not reduced after the thermal process 120. Therefore, after the thermal process 120, a dielectric constant of the gate dielectric layer 12 can not be changed. Additionally, during the thermal process 120, a lattice structure of the first polysilicon layer 14 is changed into a crystalline structure. It is noted that, the nitrogen atoms 142 in the first polysilicon layer undergoing the thermal process 14' distribute near to a bottom of the first polysilicon layer undergoing the thermal process 14', as shown in FIG. 4.

Figure 5:
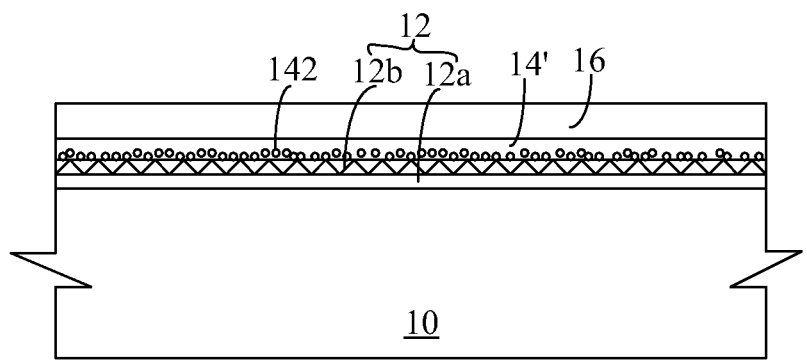
FIG. 5 illustrates a schematic, cross-sectional view of the substrate with the first polysilicon layer undergoing the thermal process, on which a second polysilicon layer is formed in accordance with an embodiment of the present invention.

Next, referring to FIG. 5, FIG. 5 illustrates a schematic, cross-sectional view of the substrate with the first polysilicon layer undergoing the thermal process, on which a second polysilicon layer is formed. As shown in FIG. 5, a second polysilicon layer 16 is formed on the first polysilicon layer undergoing the thermal process 14' by using an in-situ di-silane method. As a result, a gate structure is formed. A thickness of the second polysilicon layer 16 is in a range from 500 angstroms to 600 angstroms. In the present embodiment, a total thickness of the first polysilicon layer undergoing the thermal process 14' and the second polysilicon layer 16 is identical to a thickness of the conventional single polysilicon layer by using the single deposition step. The total thickness of the first polysilicon layer undergoing the thermal process 14' and the second polysilicon layer 16 is in a range from 600 angstroms to 800 angstroms.

Further, in the present embodiment, a lattice structure of the second polysilicon layer 16 is an amorphous structure. The average lattice structure of the first polysilicon layer undergoing the thermal process 14' is bigger than the average lattice structure of the second polysilicon layer 16.

Additionally, the gate structure and the method for forming the gate structure according to the present embodiment can be applied to an N-type metal oxide semiconductor field-effect transistor (NMOSFET) or a P-type metal oxide semiconductor field-effect transistor (NMOSFET). Referring to FIG. 6, when the gate structure formed by using the present method is applied to the N-type metal oxide semiconductor field-effect transistor, a gate leakage current of the N-type metal oxide semiconductor field-effect transistor can be reduced from 6.5 A/cm$^2$ to 3.2 A/cm$^2$. In other words, the gate leakage current of the N-type metal oxide semiconductor field-effect transistor having the gate structure formed by using the present method is 50% of the gate leakage current of the N-type metal oxide semiconductor field-effect transistor having the gate structure with the conventional single polysilicon layer by using the single deposition step. Referring to FIG. 7, when the gate structure formed by using the present method is applied to the P-type metal oxide semiconductor field-effect transistor, a gate leakage current of the P-type metal oxide semiconductor field-effect transistor can be reduced from 1.6 A/cm$^2$ to 0.8 A/cm$^2$. In other words, the gate leakage current of the P-type metal oxide semiconductor field-effect transistor having the gate structure formed by using the present method is also 50% of the gate leakage current of the P-type metal oxide semiconductor field-effect transistor having the gate structure with the conventional single polysilicon layer by using the single deposition step.

In summary, the thinner first polysilicon layer is firstly formed on the gate dielectric layer so that the thinner first polysilicon layer can protect the gate dielectric layer during the thermal process. Thus, the nitrogen atoms inside the gate dielectric layer do not lose out of the gate dielectric layer. Thus, the out-gassing phenomenon can be avoided, and a dielectric constant of the gate dielectric layer can not be changed. Further, a leakage current of a semiconductor component using the gate structure will be reduced, thereby increasing the reliability of the semiconductor component and improving the performance of the semiconductor component.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a gate structure, comprising:
   providing a substrate;
   forming a silicon oxide layer on the substrate;
   applying a decoupled plasma-nitridation process to the silicon oxide layer so as to form a silicon oxynitride layer;
   forming a first polysilicon layer on the silicon oxynitride layer;
   applying a thermal process to the silicon oxynitride layer having the first polysilicon layer formed thereon, wherein the thermal process comprises:
      a first annealing process by introducing nitrogen gas at a temperature ranging from 750° C. to 850° C.; and
      a second annealing process by introducing a second gas at a second temperature; and
   forming a second polysilicon layer on the first polysilicon layer after the thermal process.

2. The method as claimed in claim 1, wherein the silicon oxide layer is formed on the substrate by using an in-situ steam generation method.

3. The method as claimed in claim 1, wherein a thickness of the silicon oxide layer is in a range from 10 angstroms to 20 angstroms.

4. The method as claimed in claim 1, wherein an operating pressure of the decoupled plasma-nitridation process is in a range from 5 millitorrs to 25 millitorrs.

5. The semiconductor chip package structure as claimed in claim 1, wherein a total operating time of the decoupled plasma-nitridation process is in a range from 70 seconds to 80 seconds.

6. The method as claimed in claim 1, wherein a thickness of the first polysilicon layer is in a range from 100 angstroms to 200 angstroms.

7. The method as claimed in claim 1, wherein the second gas is oxygen, and the second temperature is in a range from 550° C. to 650° C.

8. The method as claimed in claim 1, wherein the first polysilicon layer and the second polysilicon layer are formed by using an in-situ di-silane method.

9. The method as claimed in claim 1, wherein a thickness of the second polysilicon layer is in a range from 500 angstroms to 600 angstroms.

* * * * *